United States Patent [19]
Chow et al.

[11] Patent Number: 5,489,786
[45] Date of Patent: Feb. 6, 1996

[54] CURRENT-CONTROLLED RESONANT TUNNELING DEVICE

[75] Inventors: David H. Chow, Newbury Park; Joel N. Schulman, Agoura, both of Calif.

[73] Assignee: Hughes Aircraft Company, Los Angeles, Calif.

[21] Appl. No.: 323,200

[22] Filed: Oct. 14, 1994

Related U.S. Application Data

[63] Continuation of Ser. No. 34,021, Mar. 22, 1993, abandoned.

[51] Int. Cl.$^6$ .......................... H01L 29/205; H01L 29/88
[52] U.S. Cl. ................................. 257/25; 257/22; 257/23; 257/18; 257/201
[58] Field of Search ................................. 257/22, 23, 25, 257/18, 201

[56] References Cited

FOREIGN PATENT DOCUMENTS

| 1241870 | 9/1989 | Japan . |
| WO88/00398 | 1/1988 | WIPO . |

OTHER PUBLICATIONS

Söderström et al. *IEEE Elec. Dev. Lett.* vol. 11, No. 1 Jan. 1990 pp. 27–29 "InAB/AlSb . . . Devices".
Beresford et al., *Appl. Phys Lett.*, vol. 54, No. 19, 8 May 1989 pp. 1899–1901 "Negative . . . Temperature".
Chow, D. H. and Schulman J. N., "Intrinsic current bistability in InAs/Al$_x$Ga$_{1-x}$Sb resonant tunneling devices," *Applied Phys. Lett.*, vol. 64, #1, 3 Jan. 1994, pp. 76–78.
Schulman, J. N., Chow, D. H. and Hasenberg, T. C., "InAs/Antimonide–Based Resonant Tunneling Structures with Ternary Alloy Layers," *Proceedings of the Sixth International Conference on Modulated Semiconductor Structures*, Garmisch–Partenkirchen, Germany, 23–27 Aug. 1993, ISSN 0038–1101, Solid–State Electronics, Apr.–Jun. 1994, pp. 981–985.
IBM Technical Disclosure Bulletin, "InAs–GaSb Quantum Well Resonant Tunnel Diode," vol. 31, No. 11, Apr. 1989, pp. 442–444.

*Primary Examiner*—Jerome Jackson
*Attorney, Agent, or Firm*—Vijayalakshmi D. Duraiswamy; Wanda K. Denson-Low

[57] ABSTRACT

A current-controlled resonant tunneling diode (RTD) having an InAs quantum well, AlGaSb barriers and InAs cladding layers is disclosed. The RTD of this invention displays an S-shaped negative differential resistance in its I-V relationship. As a result, the RTD displays the bistability necessary to greatly enhance the speed of operation of many key electronic components by eliminating the need for large load resistances in the circuit design.

5 Claims, 3 Drawing Sheets

CURRENT-CONTROLLED RESONANT TUNNELING DEVICE

This is a continuation application Ser. No. 08/034,021, filed Mar. 22, 1993, now abandoned.

FIELD OF THE INVENTION

The present invention is related to the field of semiconductor diodes. In particular, it is directed toward the field of diodes in which advantage is taken of the phenomenon of resonant tunneling, i.e., resonant tunneling diodes (RTDs).

BACKGROUND OF THE INVENTION

Diodes are well-known in the art of electronic devices. Resonant tunneling diodes are characterized by non-linear current-voltage (I-V) relationships which display a negative differential resistance over a known domain of voltage values. Negative differential resistance exists when, over a limited range of current values, the current exhibits a decrease in value while, over the corresponding voltage domain, the value of the voltage is increased. Diodes known in the art include semiconductor tunnel diodes and voltage controlled RTDs which have been employed as switches and oscillators, among other applications.

A voltage controlled resonant tunneling diode is a variety of RTD characterized by a negative differential current-voltage relationship when the voltage is swept through a wide range of values and the current is measured. Specifically, over a known current range, RTDs show an actual decrease in the value of the current when the voltage values are increased indicating a negative differential resistance over this domain of voltage values.

Typically, prior art RTDs have comprised a double barrier-quantum well structure. In one example, a gallium arsenide quantum well layer will have relatively thin barriers of aluminum arsenide epitaxially joined to each side of the quantum well layer. The resulting structure will then be placed between two injection layers comprised of gallium arsenide. These injection layers provide a reservoir of electrons for the device.

In prior art RTDs, the barrier layers prevent the free flow of electrons through the device when a voltage is applied to the diode. When a voltage is applied to the diode, electrons are injected into the quantum barrier from the conduction band of the injection layer on the negatively biased side of the device. Only those injected electrons having specified energies can tunnel through the barrier layers and the quantum well layer. The requirement that electrons meet the tunneling conditions gives rise to the negative differential resistance characteristic over a range of voltages.

It has been proposed that incorporation of RTDs into such circuits as high speed signal processors, high frequency oscillators, flip flops and the like will result in speeds of operation of these devices currently unreachable by conventional semiconductor devices, e.g., bipolar transistors. An essential feature of key electronic components, such as flip-flops and switches is current bistability in the I-V relationship, which provides two stable state for binary logic. Current bistability exists when more than one stable value of current exists for a particular voltage value.

Previously known RTDs tend to exhibit voltage bistability, having more than one voltage value for a particular value of the current. Circuits such as those mentioned above which have incorporated RTDs have typically included a large load resistance in combination with the RTD to create the desired current bistability. Thus, the load resistances are used to convert a voltage bistability into a current bistability. However, use of these load resistances imposes a penalty on device speed.

Therefore, it is desirable to have devices which eliminate the need to include such resistances when incorporating RTDs into electronic components. An RTD which makes the elimination of large load resistances possible must exhibit the current bistability that leads to the desired enhancement of speed of operation.

SUMMARY OF THE INVENTION

Accordingly, the present invention involves the design and fabrication of a new resonant tunneling diode which displays a current-controlled negative differential resistance characteristic in its current-voltage (I-V) relationship. The diode of the present invention allows greatly enhanced speed of circuit operation by eliminating the need for large load resistances.

The present invention embodies a quantum well region having at least one layer of semiconductor material, each such layer having a specified thickness. The quantum well of the invention has at least one resonance energy level for electrons. The present invention further comprises at least a first and a second electron injection layer, each of the injection layers having a specified thickness. The quantum well is placed between and disposed from the injection layers. The injection layers are such that the injection electrons' conduction band minimum energy is about the same as, but less than, the resonance energy level of the quantum well region.

Additionally, the present invention also comprises first and second barrier layers. The first and second barrier layers have a specified thickness and have a material composition such that conduction band minimum energy for electrons in the barrier layers is greater than that for electrons in the quantum well region, while the valence band maximum energy for holes in the barrier layers is also greater than that for holes in the quantum well region. Each of the barrier layers is interposed between one of the injection layers and the quantum well. The barrier layers are joined to the quantum well in such a fashion that they are in epitaxial relationship to the quantum well and the injection layers. The epitaxial relationship ensures that conditions suitable for resonant tunneling are present.

In the present invention, the well for electrons is a barrier for holes. Likewise, the barriers for electrons are wells for holes. Due to this band alignment, electrons and holes may occupy levels with a small spatial separation. The steady state recombination rate is found to be sensitive to the bias history of the diode, leading to the current bistability required by many key electronic components, such as high speed switches.

Finally, the quantum barrier of the present invention is bounded by cladding layers. The cladding layers also have specified thicknesses. In the present invention, the cladding layers are doped with majority charge carriers, i.e., they have an excess of electrons. In the embodiment disclosed, more than one cladding layer is included on each side of the quantum barrier. The more heavily doped cladding layers are thicker than cladding layers having less doping and are disposed at greater distances from the quantum barrier of the invention than are the less heavily doped cladding layers.

Accordingly, diodes fabricated in accordance with the present invention will exhibit a current-controlled negative differential resistance I-V relationship. Further, since such RTDs exhibit electron-hole recombination behavior sensitive to the bias history of the device, diodes fabricated in accordance with the present invention exhibit the current bistability desired for switching circuits without the need for large load resistances.

DETAILED DESCRIPTION OF THE INVENTION

The present invention relates to the fabrication of a resonant tunneling diode displaying a current-controlled negative differential resistance in its I-V relationship. The following description is presented to enable one of ordinary skill in the art to make and use the invention in the context of a particular application and its requirements. Various modifications to the preferred embodiment will be readily apparent to those skilled in the art, and the generic principles defined herein may be applied to other embodiments. Thus, the present invention is not intended to be limited to the embodiment shown, but is to be accorded the widest scope consistent with the principles and novel features disclosed herein.

Figure 1:
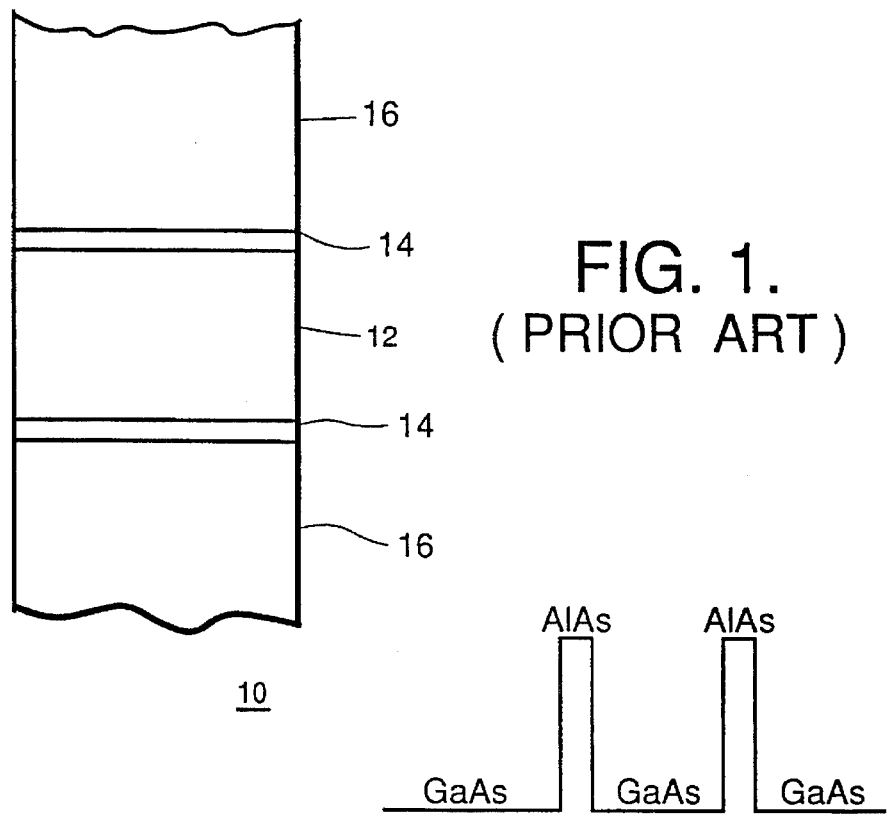
FIG. 1 shows a diagram of a RTD in accordance with the prior art.

FIG. 1 shows a diagram of an RTD 10 in accordance with the prior art. As discussed above, the RTD 10 comprises a layer 12 of gallium arsenide, for example, epitaxially bonded to layers 14 of aluminum arsenide which serve as barriers to the free flow of electrons. Layers of gallium arsenide 16 disposed on either side of the barrier layers 14 serve as injection layers for electrons.

Figure 2:
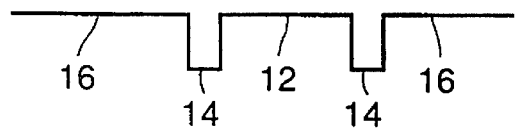
FIG. 2 shows the energy band diagram for the prior art RTD.

Referring now to FIG. 2, electrons are injected into the quantum well 12 from the injection layers 16 when a voltage is applied to the RTD 10. Only those electrons having specific energies, relative to the conduction band minimum energy, $E_C$, can tunnel through the barrier layers 14. In this figure, the electron valence band energy for each layer is represented by $E_V$.

Since injected electrons must have certain energies to successfully tunnel through the barrier, the diode current displays resonant enhancements as the applied voltage is increased. Over certain ranges of voltage, the current actually decreases with increasing voltage producing the negative differential resistance observed in the RTDs 10. This negative differential resistance characteristic is shown in FIG. 3.

Figure 3:
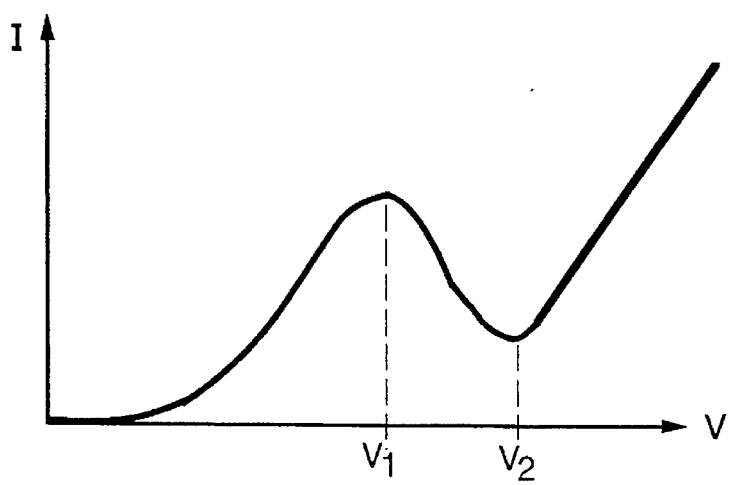
FIG. 3 shows the I-V relationship for an RTD in accordance with the prior art.

The N-shaped curve in FIG. 3 is derived by sweeping the voltage through a wide range of values while measuring the current. Thus, the negative differential resistance displayed by prior art RTDs 10 is a voltage controlled characteristic.

Figure 4:
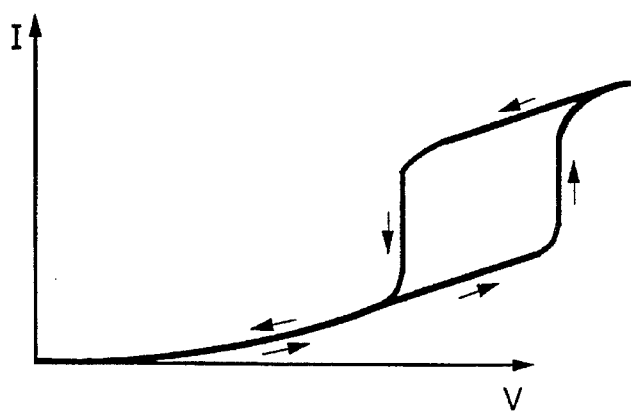
FIG. 4 shows the hysteretic I-V relationship displayed by the diodes of the present invention. The curve was taken by sweeping the voltage in both directions and measuring the current.

It has been proposed that electronic circuits based on RTDs will perform at speed unreachable by conventional semiconductor devices, e.g., bipolar transistors. An essential feature of key electronic components is bistability in device current. Bistability is illustrated in FIG. 4 which is an I-V curve taken from the device of the present invention by sweeping the voltage both up and down while measuring the current. Previously known devices are unable to achieve the required bistability without the addition of large load resistances. These load resistances slow device speed considerably.

Figure 5:
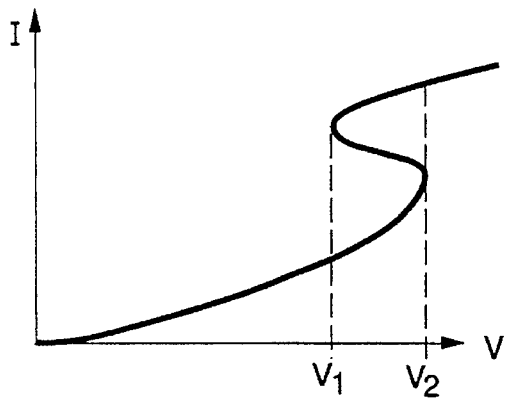
FIG. 5 shows the I-V relationship for a diode in accordance with the present invention displaying an S-shaped (current-controlled) curve. The curve was taken by sweeping the current in both directions and measuring the voltage.
Figure 6:
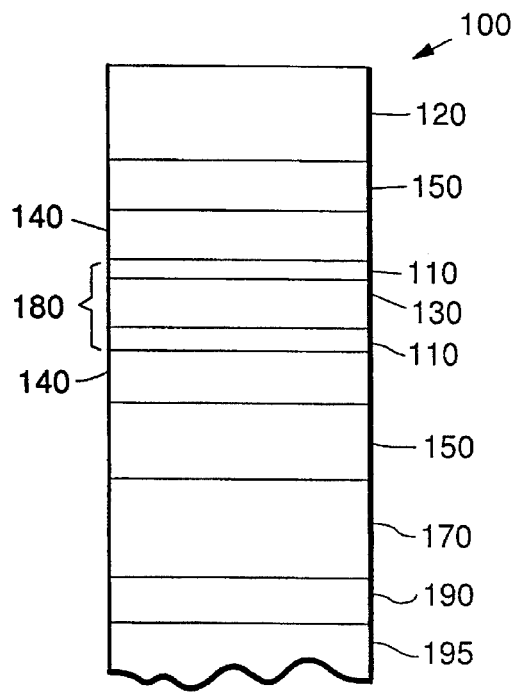
FIG. 6 shows a structural diagram of a diode in accordance with the present invention.

FIG. 5 is an S-shaped I-V curve taken from the device of the present invention by sweeping the current both up and down while measuring the voltage. An RTD which overcomes the need to include these load resistances and, therefore, allows for greatly increased speed is shown in FIG. 6. This structure can be fabricated by epitaxial growth techniques such as molecular beam epitaxy or metal—organic chemical vapor deposition. The RTD 100 of the present invention comprises an indium arsenide quantum well 130 epitaxially joined to aluminum gallium antimonide barrier layers 110. The epitaxial joining of the quantum well 130 and the barrier layers 110 results in the same type of electron transport found in prior art RTDs. The well 130 is approximately in the range of 40–200 Å in thickness. Each barrier layer is approximately in the range of 10–100 Å in thickness. The resulting active region 180 is, then, approximately in the range of 50–400 Å in thickness and has indium arsenide injection layers approximately 50–300 Å in thickness disposed on either side. The quantum barrier 180 and injection layers 140 are undoped (they contain no electrons or holes at zero bias voltage).

Disposed on either side of the active region 180 are cladding layers having sufficient silicon content such that they contain a large density of electrons. The cladding layers 150 immediately adjacent to the injection layers 140 are approximately 200–1000 Å in thickness. Those cladding layers 120, 170 more remotely disposed from the injection layers 140 are approximately greater than 1000 Å thick. One cladding layer 170 is joined to a gallium arsenide buffer 190 which in turn is joined to a gallium arsenide substrate 195.

Figure 7:
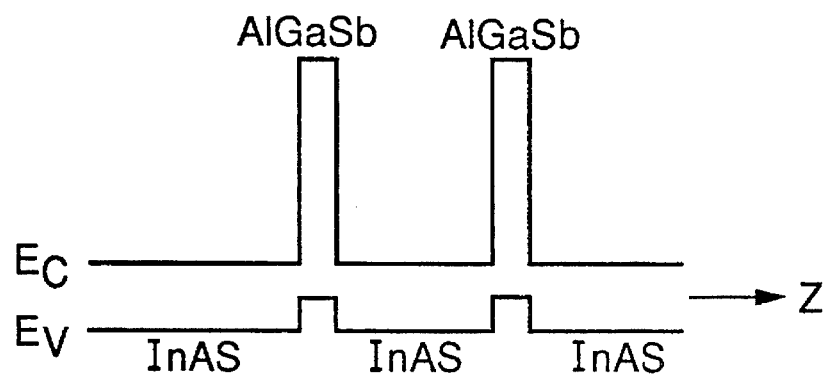
FIG. 7 shows the energy band diagram of RTDs in accordance with the present invention.

Regarding FIG. 7 the energy band diagram of the RTD 100 of the present invention is shown. As in FIG. 2, here $E_C$ is the conduction band minimum energy, while $E_V$ is the valence band maximum energy. In this diagram, it is seen that where a barrier occurs for electrons a well occurs for holes. Alternatively, a barrier for electrons is a well for holes. This is in contrast to the situation for the prior art RTD 10 as shown in FIG. 2. The energy band diagram of prior art RTDs shows that a well for electrons will be a well for holes, while a barrier for electrons is, in fact, a barrier for holes.

While the energy band diagram of FIG. 7 shows a flat band edge, it should be noted that as the voltage applied to the diode of the present invention is increased the band edges assume a more curved shape. This energy band diagram is shown in FIG. 8.

Figure 8:
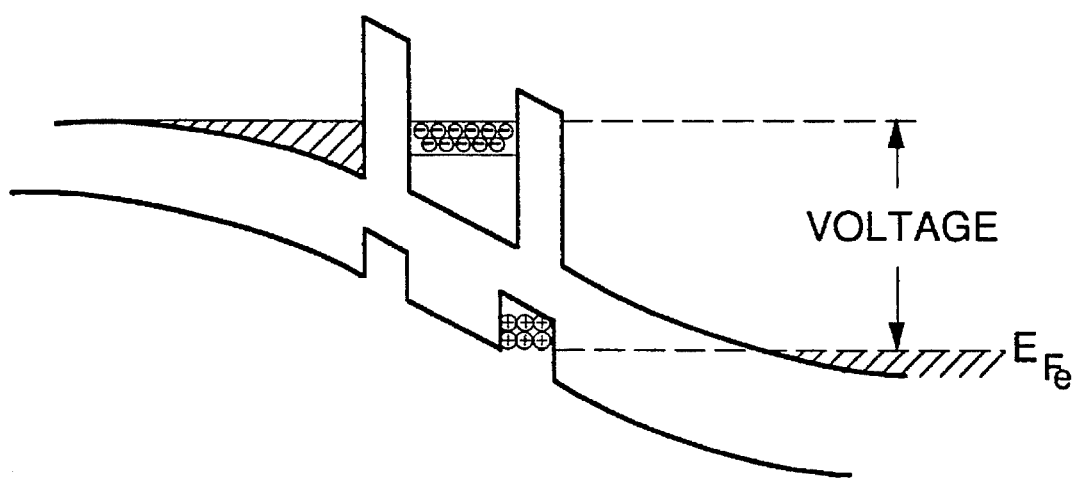
FIG. 8 shows the energy band diagram of the present invention with a voltage applied across the RTD.

In FIG. 8, the quasi fermi energy is designated as $E_{fe}$ and represents the maximum electron energy in each injection layer when the diode experiences an applied voltage. Electrons occupying states in the quantum well are designated by circles containing minus (−) signs. Holes occupying states are designated by small circles containing plus (+) signs. In the InAs/Al$_x$Ga$_{1-x}$Sb heterostructure employed in the present invention, the valence band edge of the aluminum gallium antimonide barrier layer 110 lies close to but slightly lower in energy than the indium arsenide conduction band edge. Since the cladding layers 120, 150, and 170 are doped n-type, i.e., have an excess of electrons, the majority charge carriers in the device are electrons which reside in the conduction band. It should be noted that the biased RTD of this invention exhibits a narrow set of states in both the well (for electrons) and the barrier (for holes).

Under an applied voltage, electrons begin to tunnel through the thin InAs quantum well 130 as in previously known resonant tunneling structures. The unique feature of the present invention is that holes may simultaneously begin to fill the Al$_x$Ga$_{1-x}$Sb layer 110 on the positively biased side of the device. These holes may recombine with electrons in the quantum well 130 or with electrons in the negatively biased indium arsenide cladding layer 150.

This recombination mechanism provides a mechanism for charge removal. The steady state distribution of charge will be determined by a balance between generation and recombination of electrons and holes in the active layers. The amount of charge in the active layers will, in turn, depend upon the bias history of the device. The band edge profile, and hence the current through the device, is altered by a change in the charge distribution. Therefore, this history dependent charging behavior results in a current which depends upon the voltage sweep direction. It is this dependence upon the sweep direction which gives rise to the bistability displayed in FIG. 4 and the S-shaped portion of FIG. 5 which is an I-V curve for the new diode obtained by sweeping the current applied to the device and measuring the voltage.

Therefore, one skilled in the art will recognize that the new device has the advantage of displaying an S-shaped negative differential resistance relationship providing the bistability necessary to the operation of many key computing components. Thus, the need to include large load resistances in electronic circuits incorporating RTDs is eliminated by RTDs fabricated in accordance with the present invention.

It is understood the above-mentioned embodiment is merely illustrative of the possible specific embodiments which can represent applications of the principle of the present invention. Other arrangements, including materials having the same band edge alignments as indium arsenide and aluminum gallium antimonide, may be readily devised in accordance with those principles by one of ordinary skill in the art without departing from the spirit and scope of the present invention. The scope of the invention, therefore, is limited only by the following claims.

What is claimed is:

1. A current-controlled resonant tunneling semiconductor diode comprising:

a quantum well region for electrons having at least one layer comprising indium arsenide semiconductor material, the semiconductor layer having a specified thickness, the quantum well further having at least one resonance energy level for electrons, and the quantum well for electrons further being a barrier for holes;

at least a first and a second indium arsenide electron injection layer, each injection layer having a specified thickness and a conduction band minimum, and being disposed from the quantum well; and a first and a second barrier layer for electrons comprising aluminum gallium antimonide, each barrier layer having a thickness, each barrier layer being interposed between the quantum well and a respective said injection layer, each barrier layer for electrons further being a quantum well for holes, each said quantum well for holes having at least a resonant energy level for holes, so that under an applied voltage, holes fill the barrier layer on the positively biased side of said diode and electrons which are injected by said injection layers tunnel through respective said barrier layers into said quantum well resulting in a current which depends upon the applied voltage sweep direction, and wherein the valence band edge of the aluminum gallium antimonide barrier layer lies close to but is slightly lower in energy than the indium arsenide conduction band edge.

2. The device according to claim 1 wherein the quantum well region comprises indium arsenide, the quantum well being in the range of 40–200 Å in thickness.

3. The device according to claim 1 wherein the first and second barrier layers comprise aluminum gallium antimonide, each barrier layer being in the range of 10–100 Å in thickness.

4. The device according to claim 1 wherein the first and second injection layers comprise indium arsenide semiconductor material and provide a reservoir of electrons.

5. A current-controlled resonant tunneling semiconductor diode comprising:

a quantum well region having a layer of indium arsenide semiconductor material in the range of 40–200 Å in thickness, the indium arsenide quantum well further having at least one resonant energy level for electrons and the indium arsenide quantum well further being a barrier layer for holes;

a first and a second indium arsenide electron injection layer, each injection layer in the range of 50–300 Å in thickness and having a conduction band minimum, the quantum well being interposed between the injection layers, the conduction band minimum energy of electrons in the injection layers is about that of, but less than, the resonance energy level of the quantum well region;

a first and a second barrier layer comprising aluminum gallium antimonide approximately 10–100 Å in thickness, the first barrier layer being interposed between the first injection layer and the quantum well and the second barrier layer being interposed between the second injection layer and the quantum well, the barrier layer further having sufficient gallium content that the barrier layers serve as quantum well for holes having at least a resonant energy level for holes;

a first and a second indium arsenide cladding layer approximately 200–1000 Å in thickness doped n-type, the first cladding layer in substantial contact with the first injection layer, the second cladding layer in substantial contact with the second injection layer; and a third and a fourth indium arsenide cladding layer greater than 1000 Å in thickness doped n-type to a greater degree than the first and second cladding layers, the third cladding layer in substantial contact with the first cladding layer, the fourth cladding layer in substantial contact with the second cladding layer, so that under an applied voltage, holes fill the barrier layer on the positively biased side of said diode and electrons which are injected by said injection layers tunnel through respective said barrier layers into said quantum well resulting in a current which depends upon the applied voltage sweep direction, and wherein the valence band edge of the aluminum gallium antimonide barrier layer lies close to but is slightly lower in energy than the indium arsenide conduction band edge.

* * * * *